US 6,573,850 B1

(12) United States Patent
Pennock

(10) Patent No.: US 6,573,850 B1
(45) Date of Patent: Jun. 3, 2003

(54) DIGITAL-TO-ANALOGUE CONVERTER CIRCUITS

(75) Inventor: John L. Pennock, Midlothian (GB)

(73) Assignee: Wolfson Microelectronics Limited, Edinburgh (GB)

(*) Notice: Subject to any disclaimer, the term of this patent is extended or adjusted under 35 U.S.C. 154(b) by 0 days.

(21) Appl. No.: 10/153,913

(22) Filed: May 24, 2002

(51) Int. Cl.[7] .................................................. H03M 1/66
(52) U.S. Cl. ........................................ 341/150; 341/144
(58) Field of Search ................................ 341/150, 155, 341/144

(56) References Cited

U.S. PATENT DOCUMENTS

| | | | |
|---|---|---|---|
| 4,896,156 A | 1/1990 | Garverick | 341/143 |
| 4,994,805 A | 2/1991 | Dedic et al. | 341/143 |
| 5,148,157 A | 9/1992 | Florence | 341/143 |
| 5,376,936 A | * 12/1994 | Kerth et al. | 341/150 |
| 5,703,589 A | 12/1997 | Kalthoff et al. | 341/172 |
| 5,790,064 A | 8/1998 | Fujimori | 341/172 |
| 6,081,218 A | 6/2000 | Ju et al. | 341/150 |
| 6,194,946 B1 | * 2/2001 | Fowers | 327/337 |
| 6,337,647 B1 | 1/2002 | Masson et al. | 341/150 |
| 6,452,531 B1 | * 9/2002 | Miller et al. | 341/172 |

FOREIGN PATENT DOCUMENTS

| | | | |
|---|---|---|---|
| EP | 0 450 951 A2 | 10/1991 | H03M/3/02 |
| EP | 1 130 784 A2 | 9/2001 | H03M/3/02 |
| FR | 2 666 708 | 3/1992 | H03M/1/66 |

* cited by examiner

*Primary Examiner*—Peguy JeanPierre
(74) *Attorney, Agent, or Firm*—Dickstein Shapiro Morin & Oshinsky, LLP

(57) ABSTRACT

A switched capacitor digital-to-analogue converter (DAC) 400 for reducing signal dependent loading of a reference voltage source used by the converter comprises an active circuit (102) with a feedback element. The feedback element comprises a feedback capacitor (104), a second capacitor (106) and switches (402, 110) to connect the second capacitor to one of first and second reference sources to store charge on the second capacitor and to connect the second capacitor in parallel with the feedback capacitor to share said stored charge with the feedback capacitor. The switch is further configured to connect the second capacitor to a substantially signal-independent reference prior to connection of the second capacitor to said one of said first and second references. Connecting the second capacitor to a substantially signal-independent reference source prior to the selected first or second reference gives a linear signal-dependent loading of the first and second reference sources. Connecting two such circuits with anti-phase signals then causes these linear dependences to cancel, giving a substantially signal-independent loading of these reference sources.

18 Claims, 9 Drawing Sheets

DIGITAL-TO-ANALOGUE CONVERTER CIRCUITS

FIELD OF THE INVENTION

This invention is generally concerned with digital-to-analogue converters and more particularly relates to techniques for reducing signal dependent loading of reference voltage sources used by these converters.

BACKGROUND TO THE INVENTION

Digital-analogue conversion based on converting a delta-sigma digital representation of a signal into an analogue waveform is now a commonplace technique. In a simple delta-sigma digital-to-analogue converter a string of pulses is generated, with a pulse density dependent upon the digital value to be converted, and low-pass filtered. The technique is prevalent in many high-volume application areas, for example digital audio, where several channels of high quality relatively low frequency (audio frequency) signals are required. High quality in this context typically implies −100 dB THD (Total Harmonic Distortion) and 100 dB SNR (Signal to Noise Ratio). However, in such high-volume markets manufacturing cost is also very important.

In general, a digital-to-analogue converter requires positive and negative reference voltages to define the amplitude of the output signal. A digital-to-analogue converter draws some current from these reference voltage ports, and this current will generally be signal dependent.

These reference voltages are typically generated from a source of low but non-zero output impedance, for example by a power supply or buffer with a decoupling capacitor. The source will have a finite ESR (Equivalent Series Resistance), and there will be additional resistance between the source, the decoupling and the device due to the effects of resistive PCB tracking, package lead resistance, and bond wire resistance.

The result is that any signal-dependent current drawn by the DAC from the references causes a signal-dependent voltage ripple to appear on the reference voltages actually applied to the DAC. Since the DAC output signal is proportional to the reference voltage, this multiplies the ideal digital-to-analogue converter output by this ripple. The consequent modulation of the output signal is apparent as signal distortion, for example, generating harmonic distortion components with a sine wave signal.

Furthermore in a stereo or multi-channel system it is often uneconomic to supply a digital-to-analogue converter for each channel with a separate voltage reference supply, or even separate decoupling, PCB traces, or integrated circuit pins. In these situations the reference ripple caused by one channel's DAC can appear on the reference voltage for other DACs, modulating the outputs of these other DACs as well as its own output.

This invention described herein is directed to digital-to-analogue converter circuits intended to reduce or eliminate signal dependent reference currents. A digital-to-analogue converter design for which the reference currents are substantially independent of output signal should be capable of lower distortion for a given source impedance. Alternatively, for a given acceptable level of performance, the digital-to-analogue converter should be more tolerant of source impedance, so allowing a design engineer to reduce costs by specifying fewer or cheaper, lower quality external components.

Many delta-sigma digital-to-analogue converters use switched-capacitor techniques. FIG. 1 shows an example of a simple switched-capacitor DAC 100 suitable for use in a delta-sigma DAC system.

An operational amplifier 102 has a non-inverting input connected to a constant voltage $V_{mid}$ 118, typically ground. Operational amplifier 102 has an output 120 providing an output voltage $V_{out}$ and a feedback capacitor $C_f$ 104 is connected between the output and an inverting input of the operational amplifier. A second capacitor C2 106 is switchably connected across feedback capacitor 104 by means of switches 108 and 110. Switch 108 allows one plate of capacitor 106 to be connected either to $C_f$ 104 or to a positive reference voltage $V_P$ 112 or a negative reference voltage $V_N$ 114. Switch 110 allows the other plate of capacitor 106 to be connected either to feedback capacitor 104 or to a second constant voltage, $V_{mid2}$ 116.

In operation switches 108 and 110 are controlled by a clock generator (not shown in FIG. 1) providing two clock phases Phi1 200 and Phi2 202, as shown in FIG. 2. Each of these clock signals comprises a charge phase 204 during which capacitor C2 106 is charged and a dump phase 206 during which the charge on capacitor C2 106 is shared with or dumped to the feedback capacitor $C_f$ 104. As can be seen from FIG. 2 Phi1 200 controls the charging phase and Phi2 202 controls the dump phase.

In more detail, during the charging phase Phi1 (200, 204) capacitor C2 is charged, with $V_{mid2}$ (generally the same voltage as $V_{mid}$) applied to one terminal and $V_P$ or $V_N$ applied to the other terminal. Typically values of $V_P$ 112 and $V_N$ 114 are +3V and −3V respectively, with respect to $V_{mid}$ 118. The choice of $V_P$ or $V_N$ for any particular cycle is defined by a digital delta-sigma signal applied to switch 108 during this charging phase Phi1. During the dump phase, Phi2 (202, 206), C2 is disconnected from $V_P$, $V_N$ and $V_{mid2}$ and connected in parallel with the op amp feedback capacitor $C_f$ 104.

Typically C2 106 is much smaller than the op amp feedback capacitor $C_f$ 104. The left-hand side of C2 is switched between a voltage equal to $V_{mid}$ 118 (since the inverting terminal of op amp 102 is a virtual earth, that is it is at substantially the same voltage as the non-inverting terminal) and $V_{mid2}$. Assume for simplicity that as usual $V_{mid2}=V_{mid}$. Then if $V_P$ rather than $V_N$ is applied to the other end of C2 during Phi1 200 for many consecutive clock cycles, the output $V_{out}$ 120 will converge to equal $V_P$ 112, to achieve a steady state in which both the left-hand side and the right-hand side of C2 106 are switched between equal voltages each cycle. Similarly if $V_N$ 114 is applied each cycle, $V_{out}$ will converge to $V_N$ 114. If $V_P$ and $V_N$ are each applied half the time, the output 120 will be the average of $V_P$ and $V_N$. In general for a $V_P:V_N$ duty cycle of m: (1−m), the steady-state output will be given by $V_{out}=m*V_P+(1-m)*V_N$. In this context "duty cycle" should be understood as the fraction, proportion or ratio of the number of connections to $V_P$ to the number of connections to $V_N$, for example measured in clock cycles.

The duty cycle is controlled by a digital delta-sigma signal to alternately connect C2 106 to $V_P$ and $V_N$ to provide the required output voltage 120. This output voltage 120 will vary from $V_P$ to $V_N$ according to the duty cycle applied. Thus, in effect, the DAC circuit may be considered as having a gain from the voltages (112 and 114) applied to the switched capacitor to the output 102 defined by $(V_{out,max}-V_{out,min})/(V_P-V_N)$ of substantially unity. The skilled person will recognise that the gain of circuit 100 may be adjusted, for example, by connecting a voltage divider to output 120 and taking the voltage for capacitor $C_f$ 104 from a tap point on this divider, for example to provide a gain of 2. However typically the circuit will have a relatively low gain, for example less than 10 and more typically less than 3. This also applies to the DAC circuits which are described later.

The applicant has recognised that the above-described prior art DAC circuit suffers from a problem associated with signal-dependent loading of reference voltage sources for voltages $V_P$ 112 and $V_N$ 114. The effects of signal-dependent loading of reference voltage supplies are known in the context of other circuits, but it has not previously been recognised that switched capacitor DAC circuits of the type shown in FIG. 1, in which a charge-sharing capacitor connected in parallel with a feedback capacitor is alternately connected to both positive and negative reference voltage sources, can also suffer from this problem. Thus, for example, U.S. Pat. No. 5,790,064 is concerned with mitigating the effects of signal-dependant reference source loading for a switched capacitor integrator, which has theoretically infinite gain at dc and which does not operate on the principle of charge sharing, instead dumping charge into an input of an operational amplifier which in turn drives an integration capacitor. Other switched capacitor integrators are described in U.S. Pat. No. 5,703,589 and FR 2,666,708. The integrators of these prior art circuits all form part of analogue-to-digital converter circuits and are not intended or suitable for use as high quality digital-to-analogue converters. Background prior art can be found in U.S. Pat. Nos. 4,896,156, 4,994,805, EP 0 450 951 (and U.S. Pat. No. 5,148,167), U.S. Pat. Nos. 6,081,218, 6,337,647, EP 1130 784 and in IEEE Solid State Circuit Conference (ISSCC) 2000 paper "A 120 dB Multi-bit SC Audio DAC with Second Order Noise Shaping", J Rhode, Xue-Mei Gong et al., pages 344–5.

The manner in which signal-dependent reference source loading arises in the DAC circuit of FIG. 1 can be seen by considering the charge taken from $V_P$ and $V_N$ averaged over many cycles. For the above m: (1−m) duty cycle, and assuming for simplicity that C2<<Cf, so that cycle-by-cycle ripple on $V_{out}$ is small, for $V_P$ this is given by:

$$m*(V_P - V_{out})*C2 = m*(V_P - (m*V_P + (1-m)*V_N))*C2$$
$$= m*(1-m)*(V_P - V_N)*C2$$

This has a parabolic dependence on m, with zeros at m=0 and m=1, and a maximum of $0.25*(V_P-V_N)*C2$ at m=0.5. $V_N$ shows a similar dependence.

FIG. 3 shows a digital-to-analogue converter 300 with a differential voltage output 120a, b, based upon the circuit of FIG. 1. As can be seen from inspection of FIG. 3, the differential DAC 300 comprises two similar but mirrored circuits 100a, 100b, each corresponding to DAC 100. The positive differential signal processing circuit portion 100a generates a positive output $V_{out}^+$ 120a and the negative differential signal processing portion 100b generates a negative voltage output $V_{out}^-$ 120b. Likewise the positive circuit portion 100a is coupled to first reference voltage supplies $V_P^+$ 112a and $V_N^+$ 114a and the negative circuit portion 100b is coupled to second reference voltage supplies $V_P^-$ 112b and $V_N^-$ 114b.

Preferably $V_P^+$ 112a and $V_P^{-1}$ 112b are supplied from a common positive reference voltage source and $V_N^+$ 114a and $V_N^-$ 114b are supplied from a common negative reference voltage source. Thus preferably $V_P^+$ and $V_P^-$ are at the same voltage and the $V_N^+$ and the $V_N^-$ are at the same voltage. As can be seen C2$^+$ 106a is switched to references $V_P^+$ 112a and $V_N^+$ 114a and C2$^-$ 106b is switched to references $V_P^-$ 112b and $V_N^-$ 114b. Voltages $V_{mid2}^+$ 116a and $V_{mid2}^-$ 116b preferably have the same value, preferably the value of $V_{mid}$ 118, typically ground. Preferably feedback capacitors 104a, b and switched capacitors 106a, b have the same value and op amps 102a and 102b are matched. Op amps 102a, b may comprise a single differential-input, differential-output op amp. These same comments also apply to the later described differential DAC circuits.

Continuing to refer to FIG. 3, in operation, whenever $V_P^+$ is chosen to charge C2$^+$ $V_N^-$ is selected to charge C2$^-$. Thus by symmetry one can write $V_{out}^-=m*V_N^-+(1-m)*V_P^-$. (When m=0.5, $V_{out}^+=V_{out}^-=(V_P+V_N)/2$. As m varies $V_{out}^+$ and $V_{out}^-$ will swing in equal amplitude but opposite polarities about this common-mode voltage.)

The average charge taken from $V_P^+$ will be as above:

$$m*(V_P^+ - V_{out}^+)*C2^+ = m*(V_P^+ - (m*V_P^+ + (1-m)*V_N^+))*C2$$
$$= m*(1-m)*(V_P^+ - V_N^+)*C2^+.$$

The average charge taken from VP$^-$ will be:

$$(1-m)*(V_P^- - V_{out}^-)*C2^- = (1-m)*(V_P^- - m*V_N^- - (1-m)*V_P^-)*C2^-$$
$$= (1-m)*m*(V_P^- - V_N^-)*C2^-$$

Thus the total charge taken from $V_P$ (that is $V_P^+$ and $V_P^-$) is $2*m*(1-m)*(V_P-V_N)*C2$. This is just double the charge of the single-sided implementation, as might be surmised by the symmetries of the circuit. Again the function is parabolic, with a minimum of zero (for m=0 or 1) and a maximum of $0.5*(V_P-V_N)*C2$.

To take an example, consider a case where $V_P$=+3V, $V_N$=−3V, and C2=10 pF. Assuming the circuit is clocked at 10 MHz, this will give rise to a current varying from zero to $0.5*(+3V-(-3V))*10$ pF$*10$ MHz=300 μA drawn from $V_P$ and $V_N$ depending on the low-frequency level of the output signal $V_{out}$. If the equivalent source impedance of the sources of $V_P$ and $V_N$ are 1 ohm each, this will give a modulation of $(V_P-V_N)$ of 0.6 m Vpk-pk., that is 0.1% of $(V_P-V_N)$. This will modulate the output signal by a similar amount (as with a multiplying DAC) and is a gross effect in a system aimed at typically −100 dB (0.001%) THD.

There is therefore a need for charge-sharing, switched capacitor DAC circuits which exhibit reduced signal-dependent loading of reference sources.

SUMMARY OF THE INVENTION

According to a first aspect of the present invention there is therefore provided a switched capacitor digital-to-analogue converter (DAC) comprising an active circuit with a feedback element, the feedback element comprising a feedback capacitor, a second capacitor and a switch to connect the second capacitor to one of first and second references to store charge on the second capacitor and to connect the second capacitor in parallel with the feedback capacitor to share said stored charge with the feedback capacitor; wherein the switch is further configured to connect the second capacitor to a substantially signal-independent reference prior to connection of the second capacitor to said one of said first and second references.

Connecting the second capacitor to a substantially signal-independent reference before connecting it to one of the first and second references allows signal-dependent charges to flow onto or off the second capacitor before the capacitor is recharged. In other words the charge on the second capacitor may be brought to a substantially signal-independent or predetermined state of charge prior to its connection to one of the first and second references, so that there is little or no signal-dependent loading of these references. Generally the first and second references will comprise reference voltage sources although other forms of reference, may also be employed; they may be derived from a single reference.

The signal-independent reference may comprise an additional reference voltage source or, in a differential DAC, may be derived by averaging voltages from the two mirrored halves of the differential circuitry. This may be accomplished in a relatively simple manner by providing means to connect second capacitors of the positive and negative voltage generating portions of the differential DAC. Where one end of the second capacitors is effectively at a virtual earth one or more switches may be provided to short the live or output ends of the second capacitors together to allow the charges on these to be shared, resulting in a substantially signal-independent average charge on both these second capacitors.

In such a differential DAC first and second active circuits may be used to generate first and second analogue output voltages of substantially equal magnitude but opposite polarity with respect to another voltage, typically ground. Either one or both outputs from such a differential DAC may be used in later processing.

The digital-to-analogue converter may include a third capacitor to provide multi-bit conversion and, in this case, the third capacitor may also be connected to the same or another substantially signal-independent reference. Advantageously, particularly in such a multi-bit DAC, the switching may be simplified by providing means to selectively connect the second capacitor to one of two drive lines and means to selectively connect each of these drive lines to either the first or the second reference or to a substantially signal-independent reference. This latter may be accomplished by shorting the drive lines together.

In a related aspect the invention provides a feedback element for a switched capacitor DAC comprising a feedback capacitor, a second capacitor, a switch; and a clock generator, and wherein the clock generator is configured to control the switch to connect the second capacitor to one of first and second references to store charge on the second capacitor and to connect the second capacitor in parallel with the feedback capacitor to share said stored charge with the feedback capacitor, and wherein the clock generator is further configured to connect the second capacitor to a substantially signal-independent reference prior to connection of the second capacitor to said one of said first and second references.

This feedback element may be employed as a gain control element in a digital-to-analogue converter as described above.

According to a further aspect there is provided a switched capacitor digital-to-analogue converter in which a switched capacitor is repetitively and selectively connected to a positive and to a negative reference voltage and to a charge storage capacitor to controllably share charge with the charge storage capacitor, the digital-to-analogue converter further comprising switch means for bringing the charge on the switched capacitor to a substantially predetermined state before said connection of the switched capacitor to a said reference voltage.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Figure 1:
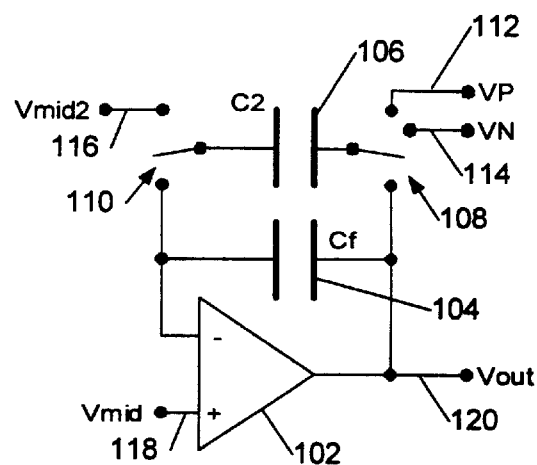
FIG. 1 shows a switched capacitor digital-to-analogue converter (DAC) according to the prior art.
Figure 4:
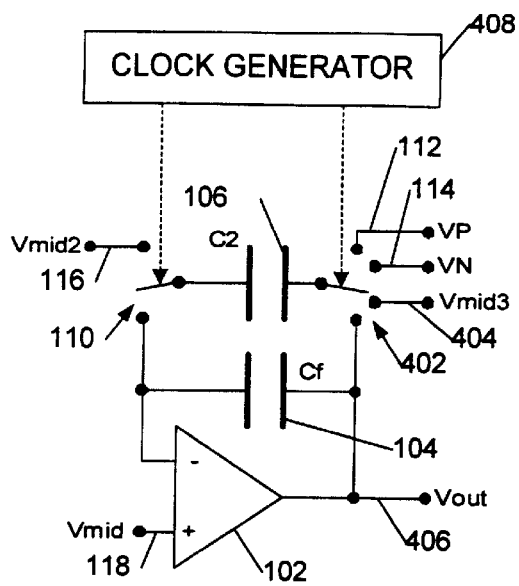
FIG. 4 shows a digital-to-analogue converter (DAC) with means to reduce signal-dependent reference source loading.

Referring to FIG. 4, this shows a digital-to-analogue converter (DAC) 400 which is a modification of the DAC 100 of FIG. 1. Many elements of DAC 400 are similar to those of DAC 100 and are hence marked with like reference numerals. However switch 108 of FIG. 1 has been replaced by a switch 402 with an additional connection 404 to a third dc level $V_{mid3}$. As the operation of the circuit of FIG. 4 is slightly different to that of FIG. 1 the output line $V_{out}$ is given new reference numeral 406. Switches 110 and 402 may comprise, for example, FET or MOSFET switches, and are controlled by a clock generator 408, as described in more detail below. In later described DAC circuits the clock generator will not be shown in the figures, for simplicity.

Figure 2:
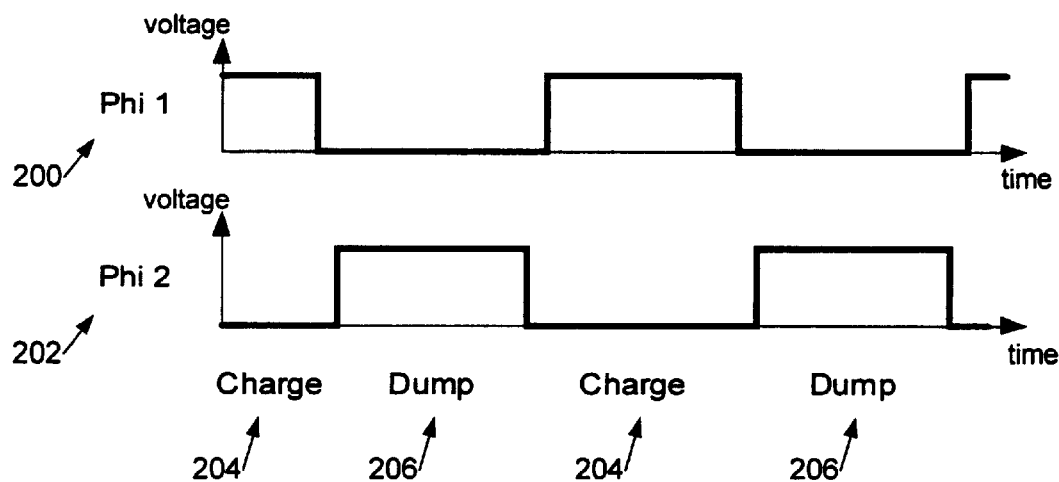
FIG. 2 shows a clocking scheme for the DAC of FIG. 1.
Figure 5:
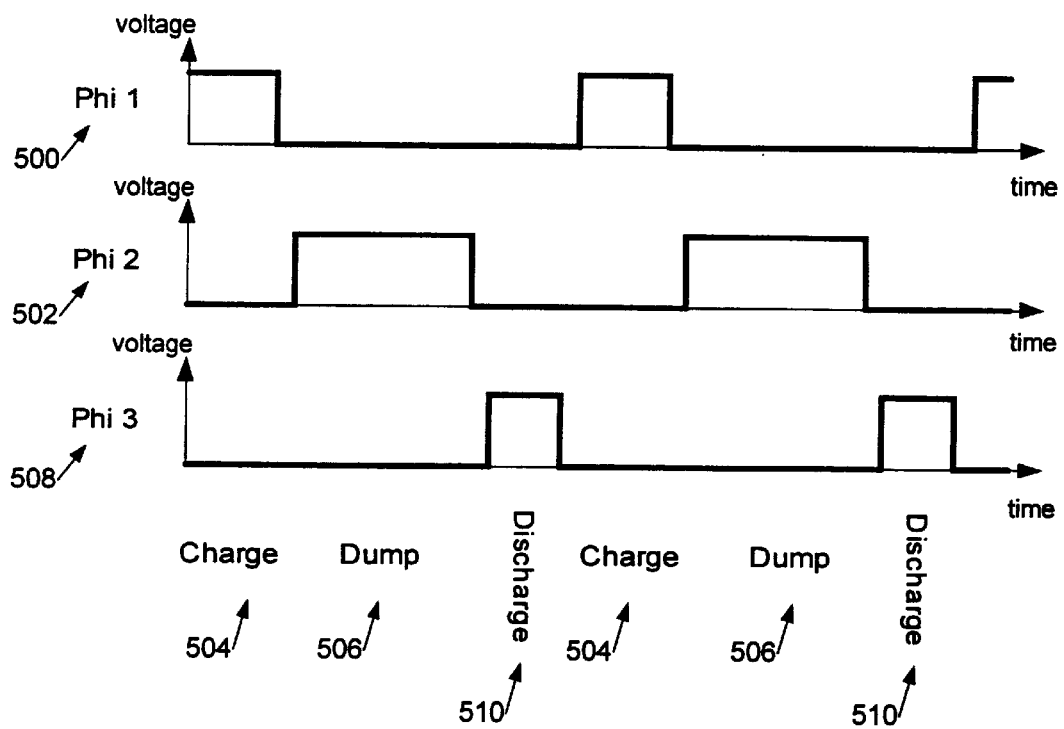
FIG. 5 shows clock waveforms for the DAC of FIG. 4.

FIG. 5 shows clock waveforms 500, 502, 508 for the circuit of FIG. 4. Clock waveforms Phi1 500 and Phi2 502 broadly correspond to clock waveforms Phi1 200 and Phi2 202 of FIG. 2, and have corresponding charge 504 and dump 506 cycles. However an additional waveform Phi3 508 provides a discharge cycle 510 prior to each charge cycle 504.

When Phi1 500 is active (i.e. during a charge cycle 504) switch 110 connects switched capacitor C2 106 to $V_{mid2}$ 116 and switch 402 connects the other plate of C2 106 to either $V_P$ 112 or $V_N$ 114. When Phi2 502 is active (i.e. during a dump cycle 506) switch 110 connects C2 106 to the inverting input of op amp 102 and switch 402 connects the other terminal of C2 106 to $V_{out}$ line 406 and feedback capacitor $C_f$ 104. When Phi3 508 is active (i.e. during a discharge cycle 510) switch 110 connects C2 106 to $V_{mid2}$ 116 and switch 402 connects the other plate of C2 106 to $V_{mid3}$ 404.

Thus, in operation, during Phi1 500 C2 106 is charged to either $V_P$ or $V_N$, as described above with reference to prior art DAC 100. Then in Phi2 502 the charge on C2 106 is dumped to feedback capacitor $C_f$ 104, again as previously described. However there is now an additional discharge phase 510 as compared with the prior art, when Phi3 508 is active. During this discharge phase C2 106 is discharged to $V_{mid3}$ 404. Generally, but not necessarily, $V_{mid3}$ 404 has the same voltage as $V_{mid}$ 118.

The effect of the additional discharge cycle 510 is to control the load on reference voltage sources supplying $V_P$ and $V_N$, so that the load shows a linear rather than quadratic dependence upon m and therefore up on $V_{out}$ 406. This can be seen by considering the average charge taken from, for example, $V_P$, which is given by $m*(V_P-V_{mid3})$. Although this charge is still signal-dependent, the signal dependence is now linear rather than parabolic.

In practice additional components may be connected in series and/or in parallel with C2 106 and/or $C_f$ 104 and there will also be effects due to finite PCB track resistance, inductance and the like but, broadly speaking, the same analysis applies.

Figure 3:
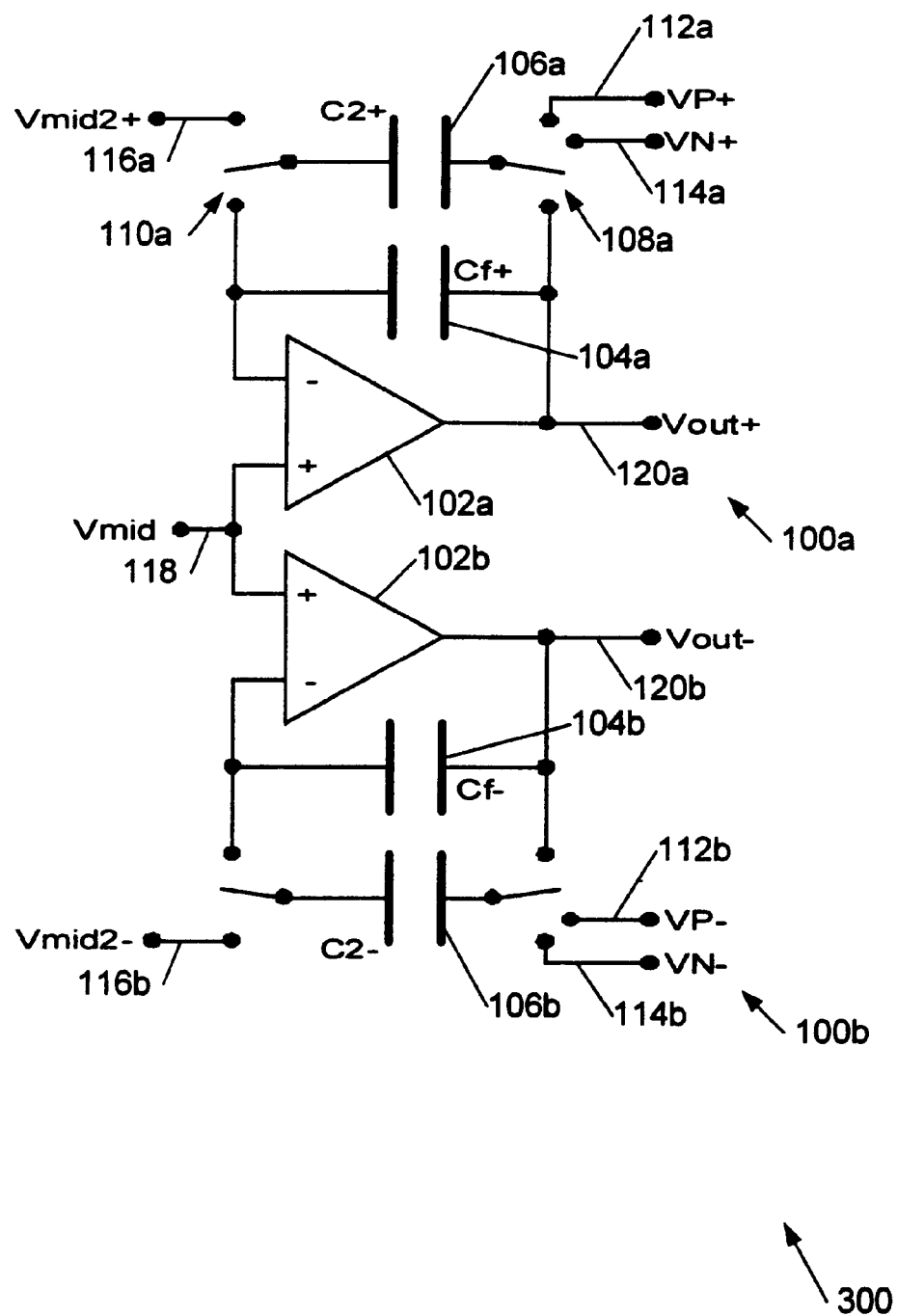
FIG. 3 shows a differential switched capacitor DAC according to the prior art.
Figure 6:
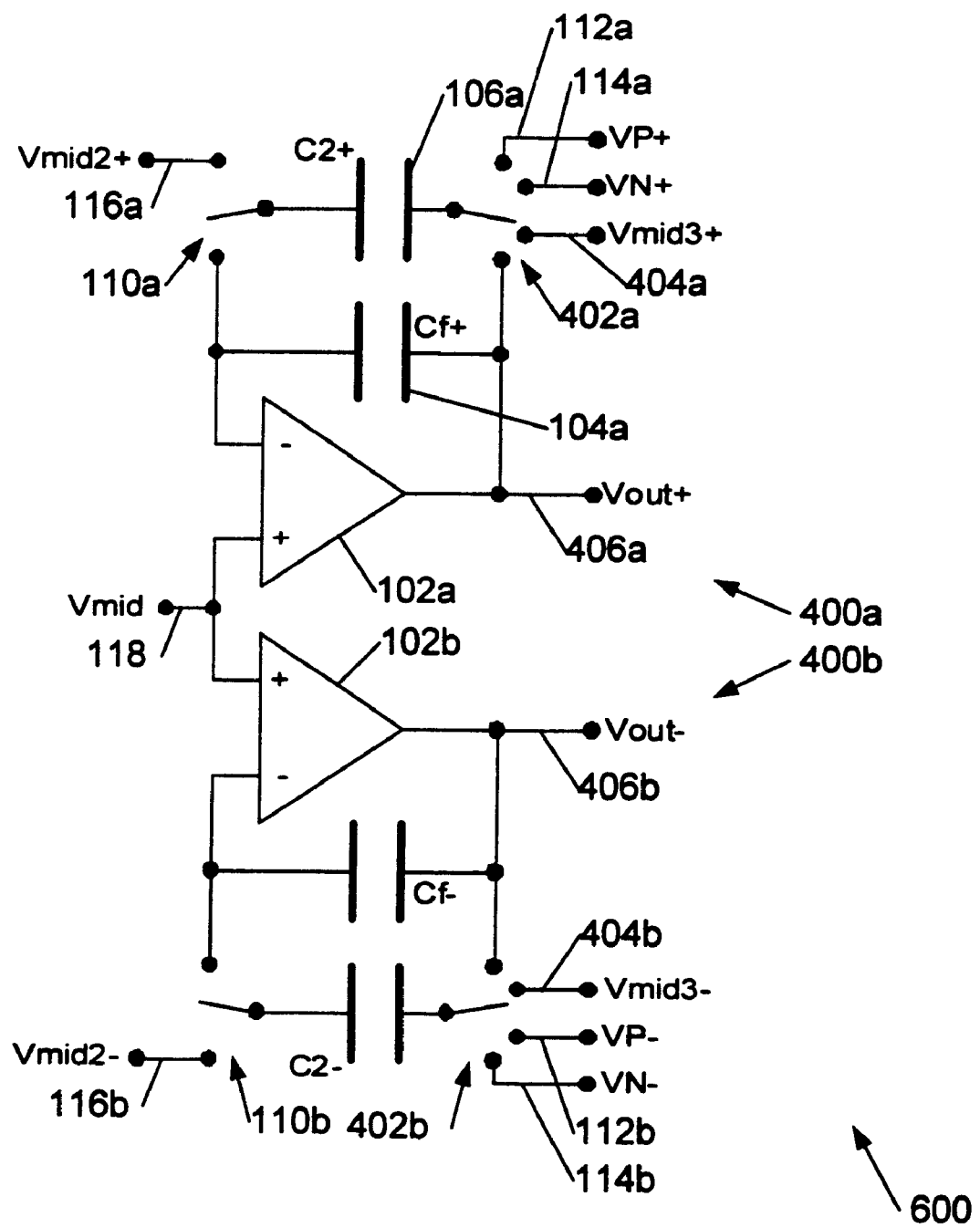
FIG. 6 shows a differential DAC with means for reducing signal-dependent reference source loading.

Referring now to FIG. 6, this shows a differential DAC 600 comprising a symmetrical pair of single-ended DAC circuits 400a and 400b, each similar to DAC 400 of FIG. 4. Differential DAC 600 broadly corresponds to the prior art DAC 300 described with reference to FIG. 3 except that each of differential DAC circuits 400a, 400b is modified as described with reference to FIG. 4. Thus DAC circuits 400a, b each have a corresponding $V_{mid3}$ connection, $V_{mid3}^+$ 404a and $V_{mid3}^-$ 404b, both preferably at the same voltage, which preferably corresponds to the voltage at $V_{mid}$ 118. Similarly, as described with reference to FIG. 4, switches 402a and 402b are configured to provide an additional discharge cycle as described with reference to FIG. 5. Again, as described with reference to FIG. 3, a common positive voltage reference source preferably provides both $V_P^+$ 112a and $V_P^-$ 112b and a common negative voltage reference source preferably provides both $V_N^+$ 114a and $V_N^-$ 14b.

Analysis of the operation of the differential DAC 600 of FIG. 6 shows that this circuit is able to provide a substantial constant load to the positive and negative reference voltage sources on a clock cycle-by-cycle basis. In more detail, the charge taken from $V_P^+$ is, from above:

$$Q^+=m*(V_P^+-V_{mid3}^+)*C2^+.$$

Similarly the charge taken from $V_P^-$ is:

$$Q^-=(1-m)*(V_P^--V_{mid3}^-)*C2^-.$$

The total charge from $V_P^+$ and $V_P^-$ is given by the sum of these expressions:

$$Q_{tot}=Q^+Q^-=(V_P-V_{mid3})*C2.$$

It can be seen that this total charge is independent of m, that is the average charge taken from $V_P$ is independent of m. In fact, in each individual cycle, $V_P$ charges either $C2^+$ or $C2^-$ from $V_{mid3}$ to $V_P$.

We should also consider the charge per cycle taken from $V_{mid3}^+$ and $V_{mid3}^-$. For the circuit of FIG. 6 as drawn, this will be equal to $(V_{out}^+-V_{mid3}^+)*C2^+$ and $(V_{out}^--V_{mid3}^-)*C2^-$ respectively. Thus the total charge taken from $V_{mid3}$ will be:

$$Q3 = (V_{out}^+ + V_{out}^- - 2*V_{mid3})*C2\_$$
$$= 2*((V_{out}^+ + V_{out}^-)/2 - V_{mid3})*C2.$$

But $(V_{out}^++V_{out}^-)/2$ is equal to $(V_P+V_N)/2$ (often equal to $V_{mid}$) so Q3 is constant (often substantially zero).

Similarly the charge taken from $V_{mid2}^+$ and $V_{mid2}^-$ can also be shown to be constant, often zero.

Note that parasitic voltage-dependent capacitances may also be present on each end of the capacitors, for example junction capacitances associated with MOS switches. These will not introduce any signal-dependence on the charge taken by $V_{mid2}$, since such capacitances will be charged only to the signal-independent voltages $V_{mid2}$ or the virtual earth voltage $V_{mid}$. $V_P$ and $V_N$ charge any capacitances associated with the other plate from $V_{mid3}$ to $V_P$ or $V_N$ each cycle: these voltages are again signal-independent, so again no signal dependence of charge is introduced. However $V_{mid3}$ charges nodes from the signal voltages $V_{out}^+$ or $V_{out}^-$ to $V_{mid3}$, so voltage dependence of any capacitances on these nodes will not usually cancel out, giving a signal dependent current to the voltage $V_{mid3}$. This effect is generally small, but for maximum performance, $V_{mid3}$ may need to be buffered. Any such buffer can be simple, as offset and noise of this voltage is not important.

Figure 7:
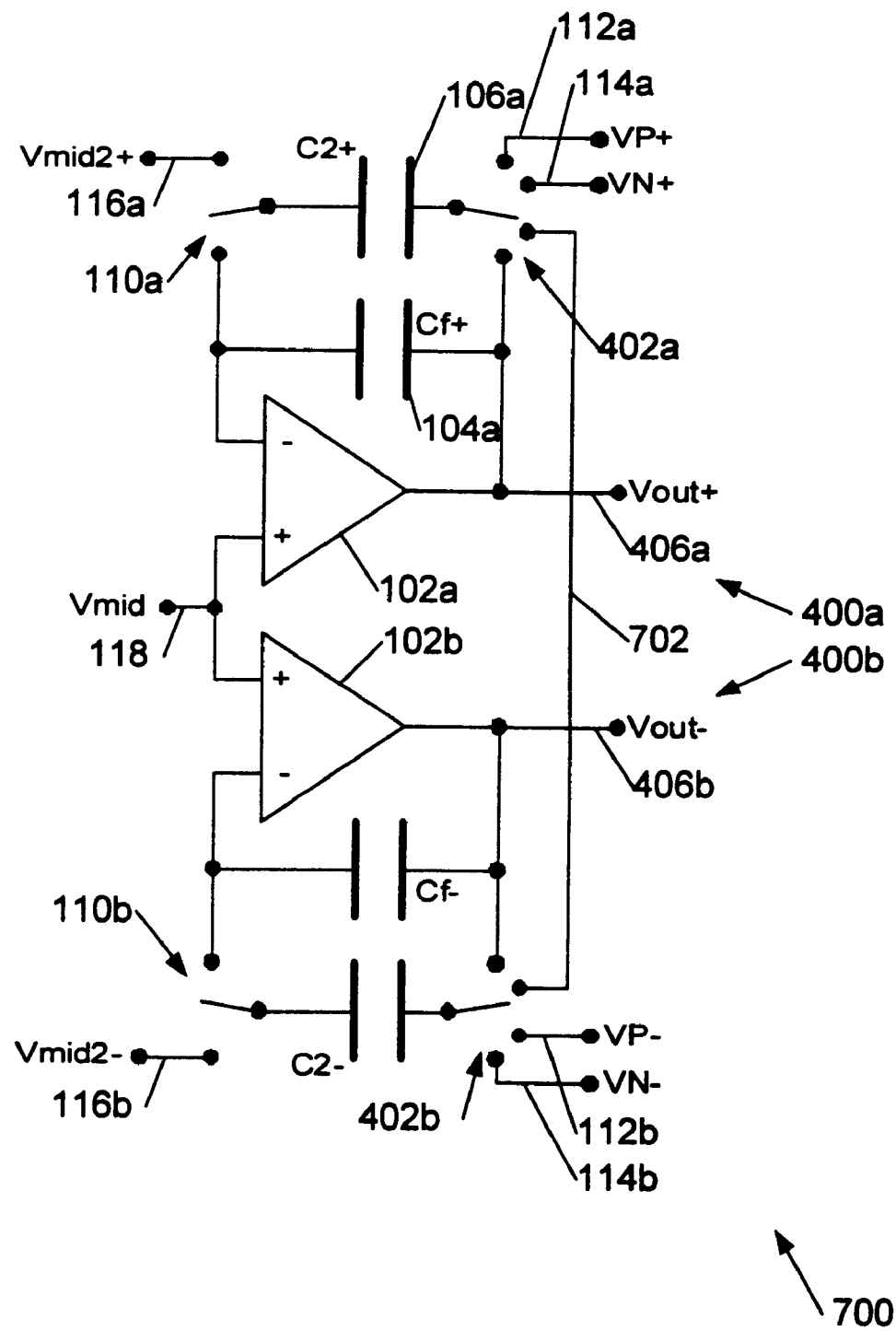
FIG. 7 shows a second differential DAC with signal-dependent reference load reduction.

The circuit of FIG. 7 is similar to the circuit of FIG. 6, but nodes $V_{mid3}^+$ 404a and $V_{mid3}^-$ 404b are shorted together to form node 702, and this node is no longer driven by a voltage source. In FIG. 7, just before the switches are closed the voltages on the output sides of $C2^+$ and $C2^-$ are symmetric about $(V_P+V_N)/2$. Thus when these are shorted $C2^+$ and $C2^-$ will share their charge and each will end up with a signal-independent voltage of substantially $(V_P+V_N)/2$. In the next phase, therefore, by a similar argument to that above, the charge taken from $V_P$ (or $V_N$) will again be substantially independent of output voltage.

This circuit has the advantage of not requiring a third voltage reference source. However, the performance will be limited by any voltage-dependent capacitances associated with the switches to node 702. Sharing of charge with these capacitances in addition to $C2^+$ and $C2^-$ will cause some signal dependent modulation of the settled voltage on 702. However such parasitics are usually small with respect to $C2^+$ and $C2^-$, so in practice at least an order of magnitude improvement is nevertheless achievable.

Figure 8:
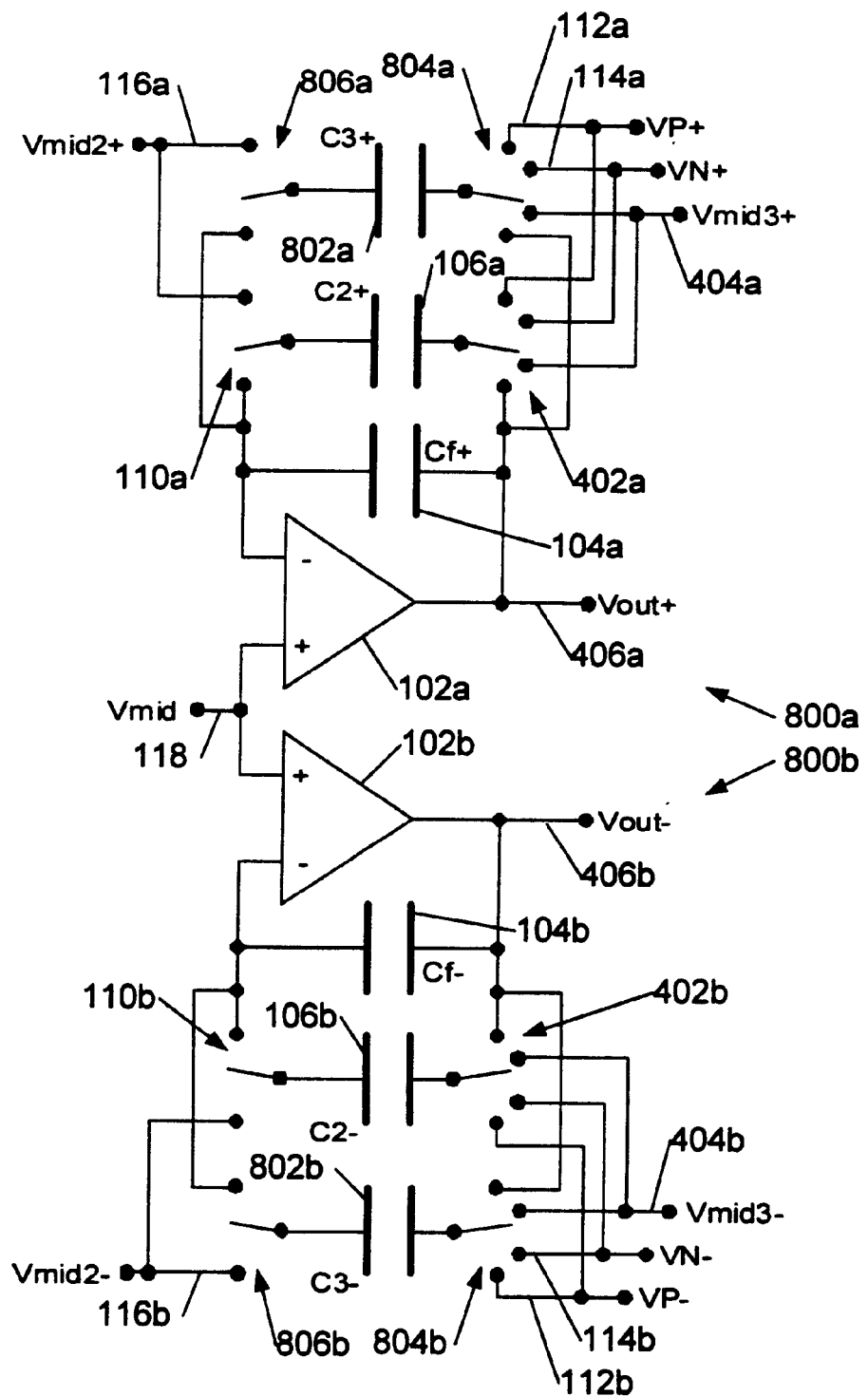
FIG. 8 shows a multi-bit differential DAC with signal-dependent reference load reduction.

The single bit differential DAC 600 of FIG. 6 may be extended for multi-bit operation as shown by differential DAC 800 of FIG. 8. Again DAC 800 comprises two mirrored differential signal processing circuits 800a, 800b which correspond to circuits 400a and 400b of DAC 600. However each of circuits 800a and 800b includes an additional switched capacitor C3 802a, b and two additional switches 804a, b and 806a, b, corresponding to switches 402a, b and 110a, b of FIG. 6. Capacitors C3 802a, b may but need not be binary weighted, that is a factor of two larger or smaller than capacitors 106a, b.

Although FIG. 8 shows just two additional capacitors for each circuit 800a, b for simplicity in practice a plurality of additional capacitors may be provided for each differential signal processing circuit portion. Thus, in effect, the switched capacitors C2 of FIG. 6 may be replaced by an array of capacitors. The capacitors in such arrays may or may not be binary weighted. In one embodiment the LSB capacitors are binary weighted, but the MSB capacitors are equally weighted, and used in a random manner to decrease the effects of mismatch. Suitable methods for deriving the necessary multi-bit delta-sigma digital control waveforms, to define the cycle-by-cycle connections to $V_P$ or $V_N$ of each capacitor in these arrays, are well known to those skilled in the art.

The operation of DAC 800 of FIG. 8 corresponds to that of DAC 600. Thus in each cycle $V_P$, say, charges either $C2^+$ 106a or $C2^-$ 106b and either $C3^+$ 802a or $C3^-$ 802b. If these capacitors are pre charged to $V_{mid3}$ 404a, b the charge taken from $V_P$ is $(C2+C3)*(V_P-V_{mid3})$ irrespective of the output signal level $V_{out}$ 406a, b or the capacitor choice.

Figure 9:
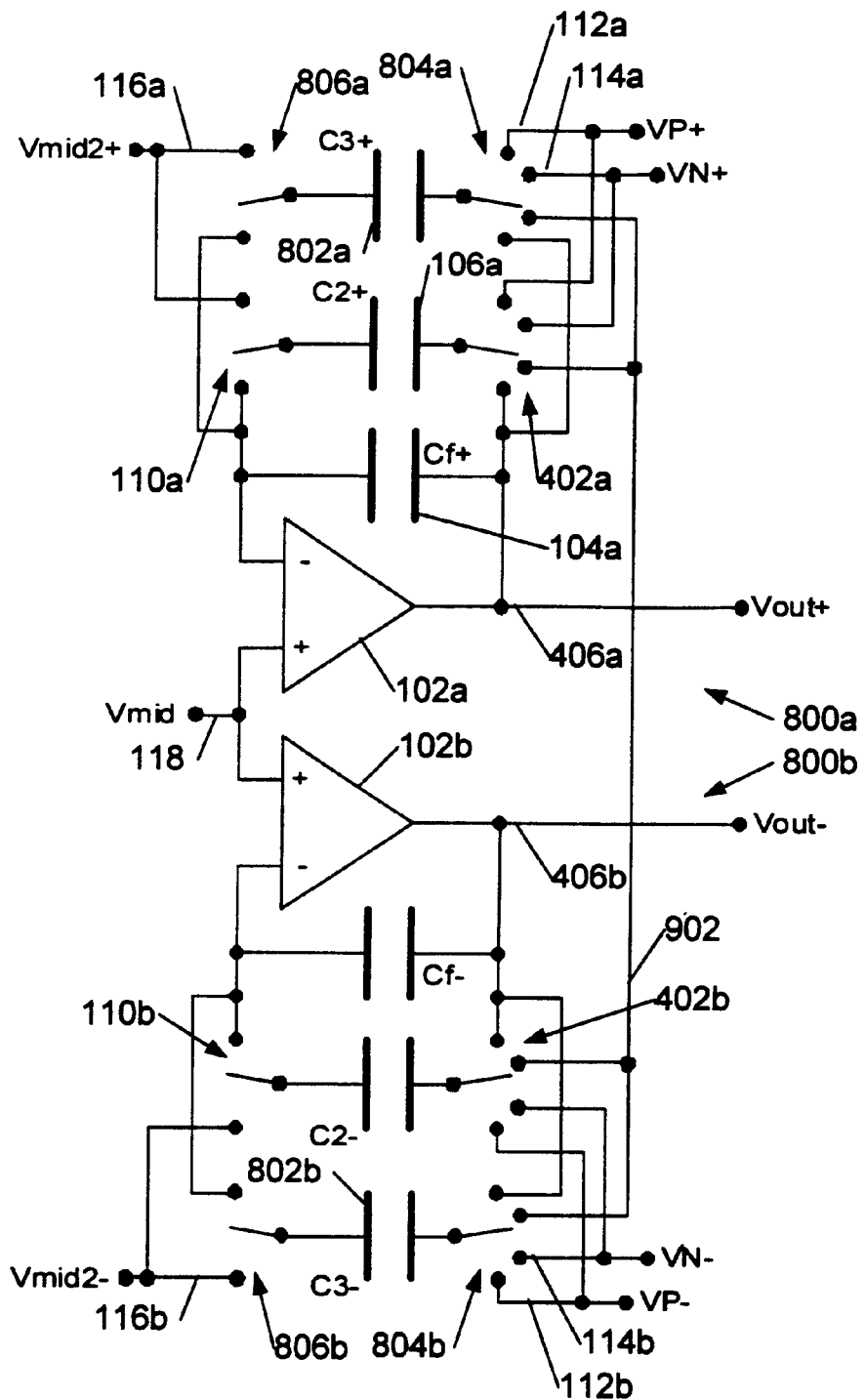
FIG. 9 shows a second multi-bit differential DAC with signal-dependent reference load reduction.

FIG. 9 shows a DAC 900 comprising a modification of DAC 800 in which $V_{mid3}$ connections 404a, b are replaced by a link 902. This modification corresponds to the above-described modification made to DAC 600 of FIG. 6 shown in FIG. 7. In DAC 900 the charge drawn from the $V_P$ reference each cycle is given by $(C2+C3)*\{(V_P-(V_P+V_N)/2\}$, which is again independent of output signal level.

Figure 10:
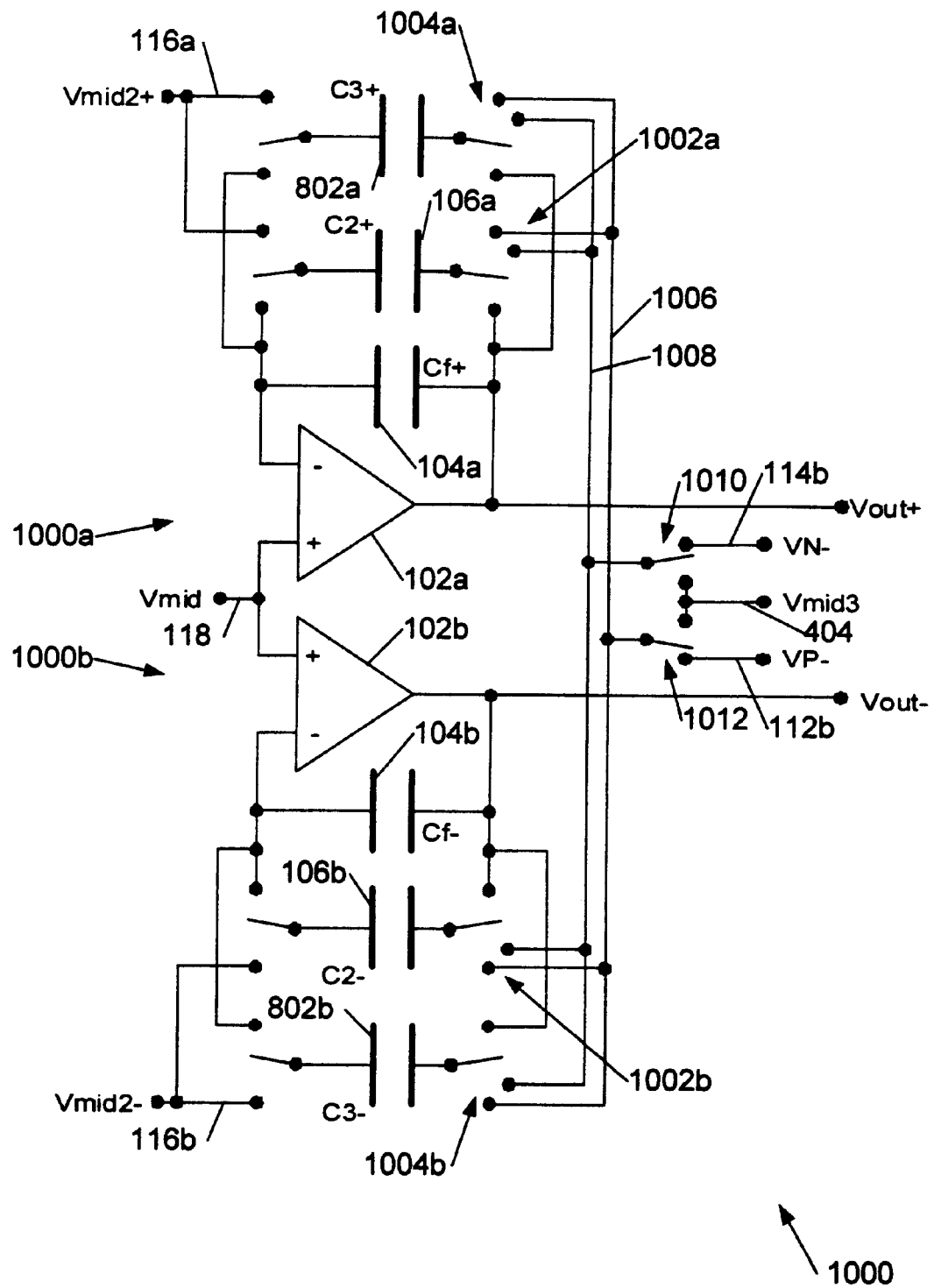
FIG. 10 shows a multi-bit differential DAC with a first alternative switching arrangement.
Figure 11:
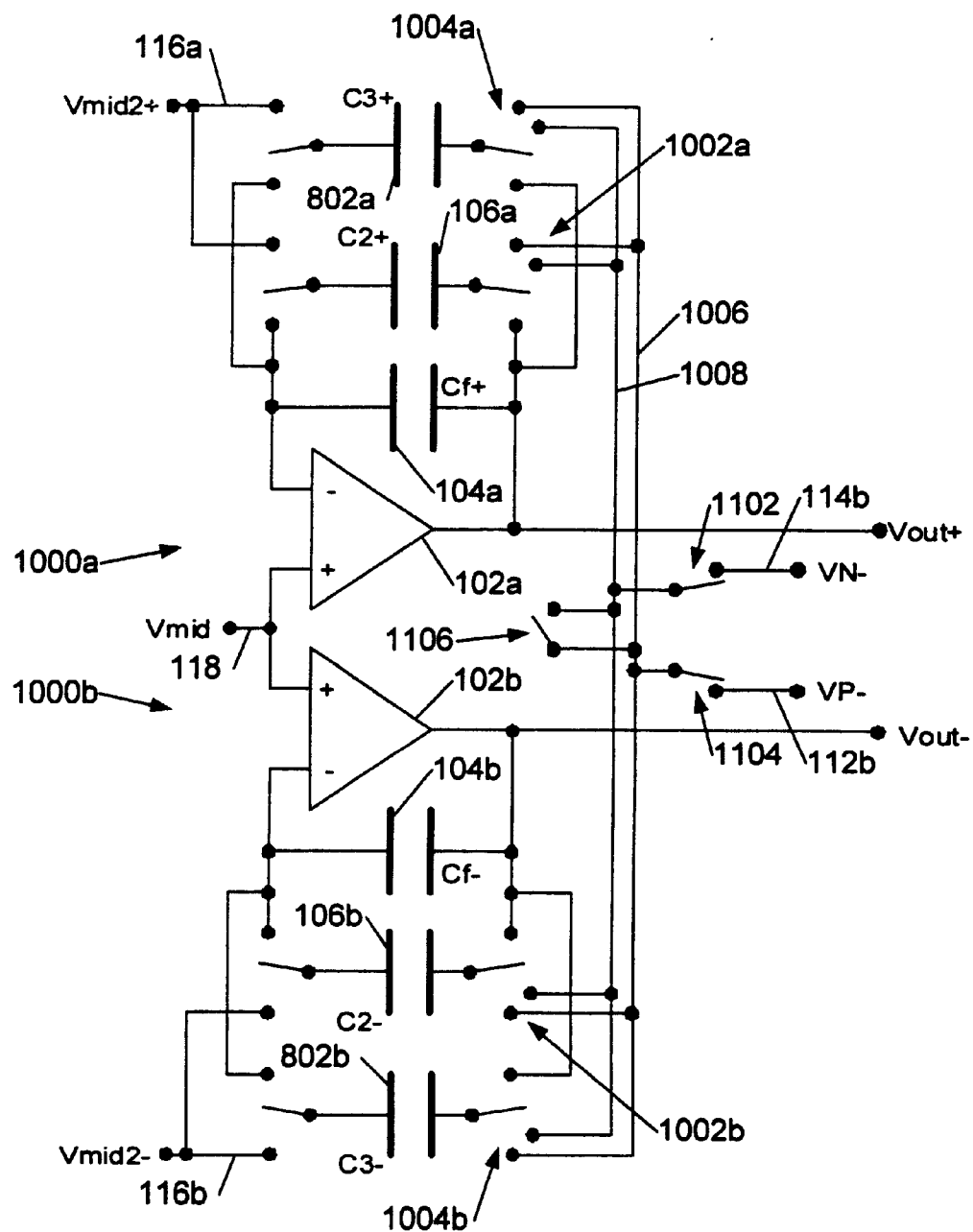
FIG. 11 shows a multi-bit differential DAC with a second alternative switching arrangement.

The DAC circuits shown in FIGS. 6 to 9 conceptually require an additional pole for the switches 402*a*, *b* and 804*a*, *b* associated with each switched capacitor. Alternative switching arrangements are shown in FIGS. 10 and 11. These alternative arrangements are particularly advantageous for multi-bit differential DAC circuits of the type shown in FIGS. 8 and 9.

Referring first to FIG. 10, this shows a DAC 1000 which is best understood as a modification to DAC 800 of FIG. 8. In DAC 1000 the positive and negative differential signal processing circuits 1000*a* and 1000*b* broadly correspond to circuit portions 800*a* and 800*b* of FIG. 8 except that, conceptually, the switches 1002*a*, *b* and 1004*a*, *b* have three rather than four poles. Furthermore, the poles, which in DAC 800 were connected to $V_P^+$ 112*a* and $V_P^-$ 112*b* and $V_N^+$ 114*a* and $V_N^-$ 114*b*, are now connected to common drive lines 1006 and 1008 respectively (and thus may be denoted $V_P$ and $V_N$ respectively). Two additional switches 1010 and 1012 are provided, switch 1010 connecting line 1008 either to $V_N^-$ 114*b* or $V_{mid3}$ 404 and switch 1012 connecting line 1006 either $V_P^-$ 112*b* or to $V_{mid3}$ 404.

Thus the switches that were previously connected directly to $V_P$ and $V_N$ are now connected via further switches. In the discharge phase these nodes are switched to $V_{mid3}$ 404 and then, in the charging phase, they are connected to $V_P$ or $V_N$. In this way only three extra switches are required for the whole array. Since $V_P$ and $V_N$ are now connected to C2 106 (and, where appropriate, C3 802) by two series switches, in some circumstances each of these switches may need to be larger (that is, they may need to provide a lower on-resistance) to achieve a low enough RC time constant for adequate settling in high-speed converters.

Note that $C2^+$, for example, may be discharged to $V_{mid3}$ either via node 1006 or node 1008. Since this discharge phase is immediately prior to the charging phase, when node 1006 is connected to $V_P$ and node 1008 is connected to $V_N$, the natural choice would be to connect $C2^+$ to 1006 in the discharge phase if it is to be next charged to $V_P$, or to 1008 if it is to be next charged to $V_N$, to avoid unnecessary activity of switch 1002*a*. This constraint is not necessary, and there may be reasons in particular cases to follow different schemes, for example charging $C2^+$ and $C2^-$ to 1006 and $C3^+$ and $C3^-$ to 1008.

The second alternative switching arrangement, shown in FIG. 11, is similar to that of FIG. 10. However, like DAC 900 of FIG. 9, the circuit is configured to connect together output ends of capacitors C2 106*a*, *b* and C3 802*a*, *b* rather than to connect the output ends of these capacitors to $V_{mid3}$ 404. Thus DAC 1100 of FIG. 11 employs three single pole switches 1102, 1104 and 1106 rather than the two-pole switches 1010 and 1012 of DAC 1000. By opening switches 1102 and 1104 and closing switch 1106 output ends of capacitors C2 106*a*, *b* and C3 802*a*, *b* are shorted together in a corresponding manner to that described above with reference to FIG. 9. Thus, in effect, the arrangement of FIG. 11 could be considered to leave $V_{mid3}$ 404 floating, that is not connected. The same functionality can be achieved by leaving the $V_{mid3}$ connection 404 of the DAC 1000 of FIG. 10 floating, with only the topological difference that the $V_{mid3}$ connections of switches 1010 and 1012 are replaced by the single switch 1106.

As discussed above, there is some freedom of choice as to which capacitors to connect to nodes 1006 and 1008. Note that if the second scheme above is followed, say, with $C2^+$ and $C2^-$ discharged to 1006 and $C3^+$ and $C3^-$ discharged to 1008, the net signal charge on each of $C2^+$ and $C2^-$ will cancel out to give a signal-independent voltage of $(V_P+V_N)/2$ on 1006. Similarly $C3^+$ and $C3^-$ will share charge to give the same voltage on 1008. This is true even in the absence of switch 1106. However, in general, this cycle-by-cycle balancing will not occur ($C2^+$ will generally be switched to the opposite node to $C2^-$, and C2 will not be equal to C3), so switch 1106 is preferable.

The skilled person will recognise that many variations of the above-described circuits are possible. For example the two series switches shown (introduced) in FIG. 11 could be split into respective switches for positive and negative-side capacitors, or split further within the multiple capacitors on each side. Such series switches could also be used even with a single-bit converter. Such schemes may have advantages in some instances in the physical layout of the DAC circuits.

Similarly the above-described differential DAC circuits are illustrated using a pair of operational amplifiers 102*a*, *b* but the skilled person will recognise that this pair of operational amplifiers may be replaced by a single differential-input, differential-output amplifier.

Although the DAC circuits have been described in the general context of delta-sigma digital control techniques, applications of the circuits are not limited to schemes in which the switching control waveforms are generated by such techniques. For example other digital filter-derived techniques or PWM (pulse width modulation) could be employed or appropriate pulse trains could be retrieved from storage, for example for digital voice or other synthesis.

The skilled person will further recognise that the above-described DAC circuits may be incorporated into other systems. For example one or more of the above-described DAC circuits may be incorporated within a switched-capacitor delta-sigma analogue-to-digital converter, in one or more feedback elements. For example, the skilled person will understand that a delta-sigma analogue-to-digital converter may be constructed by adding, for example, an integrator and a digital filter to one of the above DAC circuits.

No doubt many other effective alternatives will occur to the skilled person and it would be understood that the invention is not limited to the described embodiments and encompasses modifications apparent to those skilled in the art lying within the spirit and scope of the claims appended hereto.

I claim:

1. A switched capacitor digital-to-analogue converter (DAC) comprising an active circuit with a feedback element, the feedback element comprising a feedback capacitor, a second capacitor and a switch to connect the second capacitor to one of first and second references to store charge on the second capacitor and to connect the second capacitor in parallel with the feedback capacitor to share said stored charge with the feedback capacitor; wherein the switch is further configured to connect the second capacitor to a substantially signal-independent reference prior to connection of the second capacitor to said one of said first and second references.

2. A switched capacitor DAC as claimed in claim 1 wherein said first and second references comprise respective positive and negative reference voltage sources.

3. A switched capacitor DAC as claimed in claim 1 comprising a pair of first and second said active circuits with respective first and second said feedback elements to provide a differential analogue output.

4. A switched capacitor DAC as claimed in claim 3 wherein the switches of said respective first and second feedback elements are configured to connect together said second capacitors of said first and second feedback elements to share the charge on said second capacitors to provide said substantially signal-independent reference.

5. A switched capacitor DAC as claimed in claim 1 wherein said substantially signal-independent reference comprises a third reference voltage source.

6. A switched capacitor DAC as claimed in claim 1 wherein a said feedback element further comprises a third capacitor and a second switch to connect the third capacitor to one of said first and second references to store charge on the third capacitor and to connect the third capacitor in parallel with the feedback capacitor to share said stored charge with the feedback capacitor, and wherein the second switch is further configured to connect the third capacitor to a or the substantially signal-independent reference prior to connection of the third capacitor to said one of said first and second references.

7. A switched capacitor DAC as claimed in claim 1 comprising a pair of first and second said active circuits with respective first and second said feedback elements to provide a differential analogue output, wherein the switches of said respective first and second said feedback elements are configured to connect together said second capacitors of said first and second feedback elements to share the charge on said second capacitors to provide said substantially signal-independent reference, wherein a said feedback element further comprises a third capacitor and a second switch to connect the third capacitor to one of said first and second references to store charge on the third capacitor and to connect the third capacitor in parallel with the feedback capacitor to share said stored charge with the feedback capacitor, and wherein the second switch is further configured to connect the third capacitor to a or the substantially signal-independent reference prior to connection of the third capacitor to said one of said first and second references, wherein the second switches of said respective first and second feedback elements are configured to connect together said third capacitors of said first and second feedback elements to share the charge on said third capacitors.

8. A switched capacitor DAC as claimed in claim 1 wherein a said feedback element switch includes a first switch to selectively connect the second capacitor to one of a first and a second drive line and a second switch to connect each said drive line to one of said first and second references.

9. A switched capacitor DAC as claimed in claim 8 wherein said second switch is configured to selectively connect each said drive line to one of said first and second references and to a said substantially signal-independent reference.

10. A switched capacitor DAC as claimed in claim 8 further comprising a third switch to connect said first and second drive lines.

11. An analogue-to-digital converter incorporating the digital-to-analogue converter of claim 1.

12. A feedback element for a switched capacitor DAC comprising:
   a feedback capacitor;
   a second capacitor;
   a switch; and
   a clock generator; and
   wherein the clock generator is configured to control the switch to connect the second capacitor to one of first and second references to store charge on the second capacitor and to connect the second capacitor in parallel with the feedback capacitor to share said stored charge with the feedback capacitor, and wherein the clock generator is further configured to connect the second capacitor to a substantially signal-independent reference prior to connection of the second capacitor to said one of said first and second references.

13. A digital-to-analogue converter comprising a digitally controllable output control element including a feedback element as claimed in claim 12.

14. A digital-to-analogue converter as claimed in claim 13 having a differential voltage output, and wherein said substantially signal-independent reference is generated by averaging substantially symmetric positive and negative signals derived from substantially finctionally symmetric differential signal processing circuit portions of said digital-to-analogue converter.

15. An analogue-to-digital converter incorporating feedback element of claim 12.

16. A switched capacitor digital-to-analogue converter in which a switched capacitor is repetitively and selectively connected to a positive and to a negative reference voltage and to a charge storage capacitor to controllably share charge with the charge storage capacitor, the digital-to-analogue converter further comprising switch means for bringing the charge on the switched capacitor to a substantially predetermined state before said connection of the switched capacitor to a said reference voltage.

17. A switched capacitor digital-to-analogue converter as claimed in claim 16 wherein said switch means is configured to connect a pair of said switched capacitors in differential signal processing circuit portions of said digital-to-analogue converter.

18. An analogue-to-digital converter incorporating the digital-to-analogue converter of claim 16.

* * * * *